United States Patent
Biberger

(10) Patent No.: US 11,152,187 B2
(45) Date of Patent: Oct. 19, 2021

(54) METHOD AND APPARATUS FOR POSITIONING MICROSCOPIC SPECIMENS WITH THE AID OF A TWO-DIMENSIONAL POSITION TABLE

(71) Applicant: Carl Zeiss Microscopy GmbH, Jena (DE)

(72) Inventor: Josef Biberger, Wildenberg (DE)

(73) Assignee: Carl Zeiss Microscopy GmbH, Jena (DE)

( * ) Notice: Subject to any disclaimer, the term of this patent is extended or adjusted under 35 U.S.C. 154(b) by 41 days.

(21) Appl. No.: 16/410,505

(22) Filed: May 13, 2019

(65) Prior Publication Data

US 2019/0355548 A1 Nov. 21, 2019

(30) Foreign Application Priority Data

May 16, 2018 (DE) .................... 10 2018 207 603.0

(51) Int. Cl.
*H01J 37/20* (2006.01)
*H01J 37/26* (2006.01)
*H01J 37/304* (2006.01)

(52) U.S. Cl.
CPC .............. *H01J 37/20* (2013.01); *H01J 37/26* (2013.01); *H01J 37/3045* (2013.01)

(58) Field of Classification Search
CPC ........ H01J 37/20; H01J 37/26; H01J 37/3045; H01J 2237/20292; G02B 21/26;
(Continued)

(56) References Cited

U.S. PATENT DOCUMENTS 3,555,254 A * 1/1971 Gerber ................. G05B 19/404
318/632
5,481,111 A 1/1996 Rosar et al.
(Continued)

OTHER PUBLICATIONS

German Office Action, with translation thereof, for corresponding DE Appl No. 10 2018 207 603.0, dated Feb. 21, 2019.
(Continued)

*Primary Examiner* — Michael Maskell
(74) *Attorney, Agent, or Firm* — Fish & Richardson P.C.

(57) ABSTRACT

A method for positioning a specimen in a microscope system includes overserving and/or processing a region of interest (ROI) on the specimen. The microscope system includes: an optical axis; a movable specimen stage for receiving a specimen; a memory apparatus for storing data records that describe the positions of the specimen; and a control apparatus, which can control the movement of the specimen stage with the aid of the stored data records. The method includes: holding a specimen region (ROI) in the first position; storing a first data record, by which the first position is described, wherein the first position is defined as independent position; storing a second data record, by which the second position is described, wherein the second position is linked to the independent position; and calling one of the stored data records such that the specimen stage is moved in such a way that the specimen region is held at the position that is described by the called data record.

21 Claims, 7 Drawing Sheets

(58) Field of Classification Search
CPC ............... G01N 23/04; G01N 23/2005; G01N 23/20025; G01N 23/2251; G01N 2223/03; G01N 2223/102
USPC .................. 250/306, 307, 310, 311, 442.11, 250/492.1–492.3
See application file for complete search history.

(56) References Cited

U.S. PATENT DOCUMENTS

| | | | |
|---|---|---|---|
| 9,558,911 B2* | 1/2017 | Biberger | H01J 37/20 |
| 2002/0024012 A1* | 2/2002 | Abe | H01J 37/265 |
| | | | 250/311 |
| 2009/0039285 A1* | 2/2009 | Cooper | H01J 37/20 |
| | | | 250/442.11 |
| 2014/0291512 A1 | 10/2014 | Nakatani et al. | |

OTHER PUBLICATIONS

Carl Zeiss Microscopy GmbH; Zeiss Atlas 5, Master Youth Multiscale Challenge, Jena, Germany, Nov. 2017 (Product Information, Version 2.1).

* cited by examiner

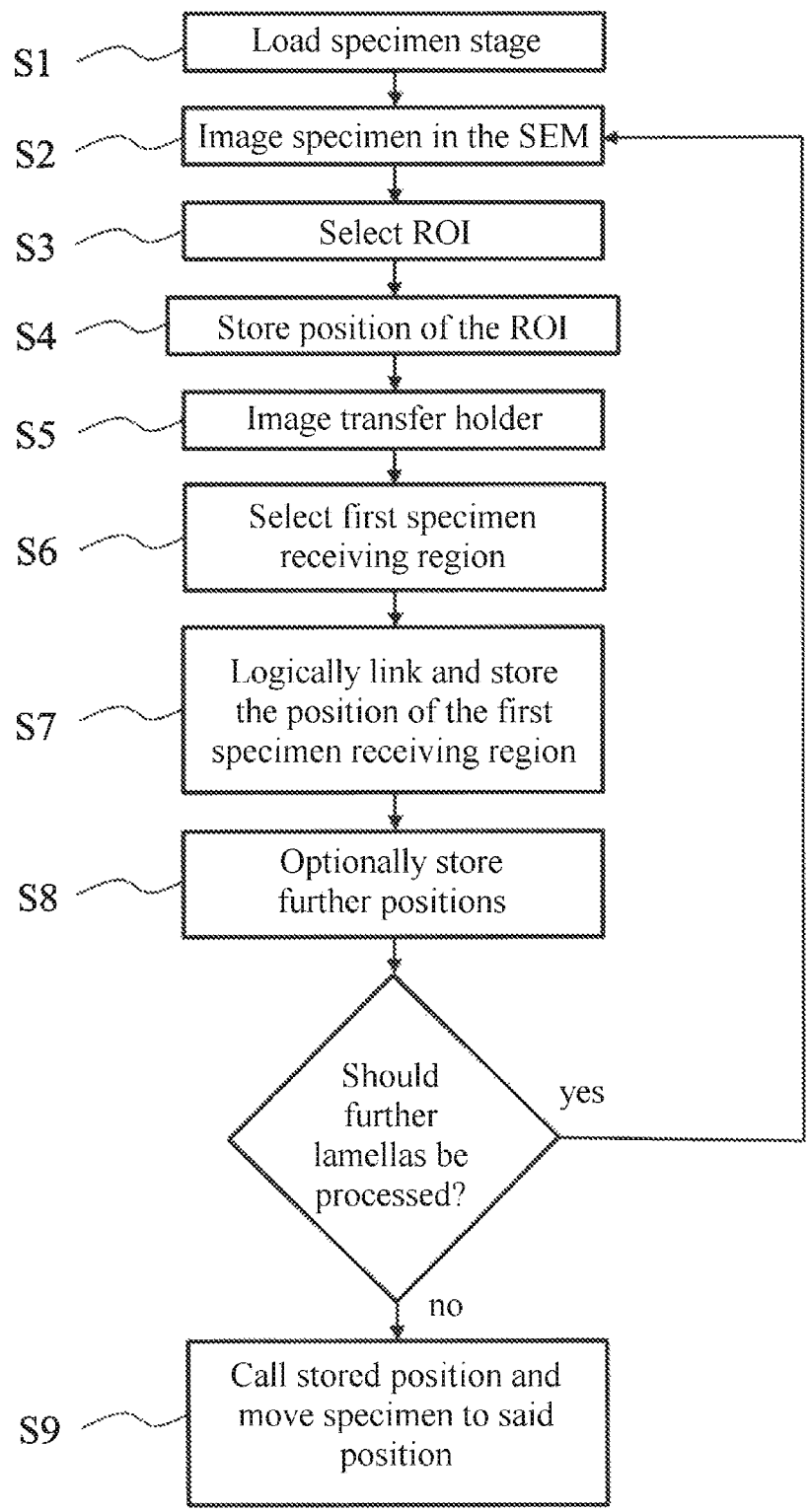

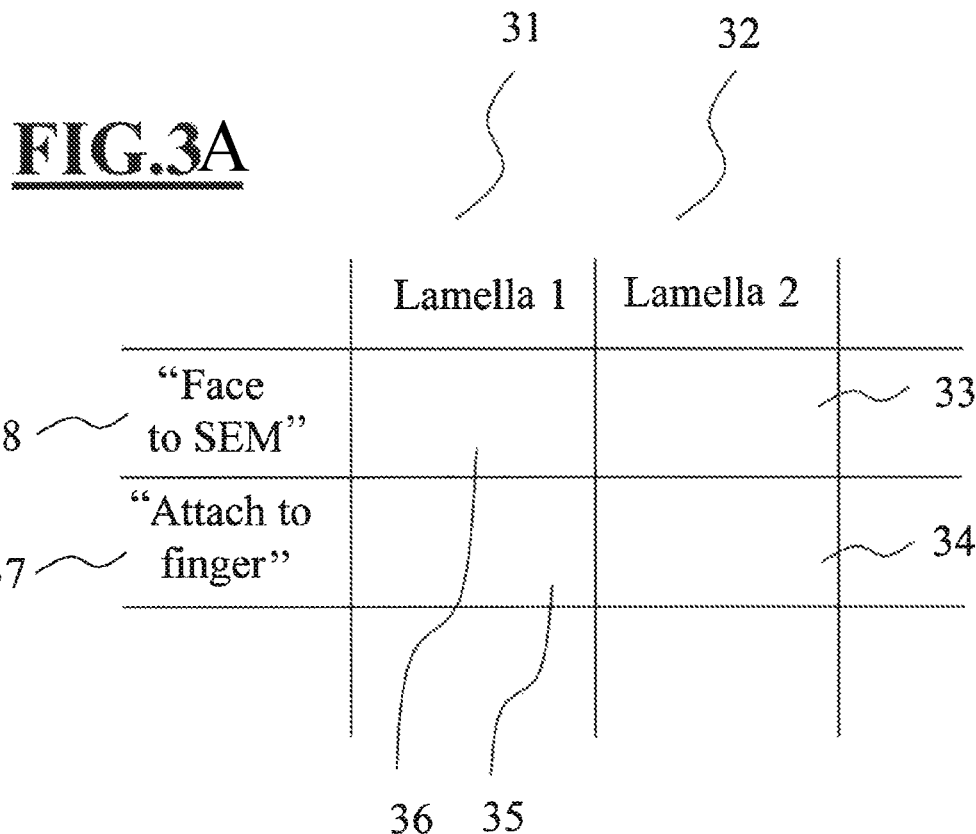
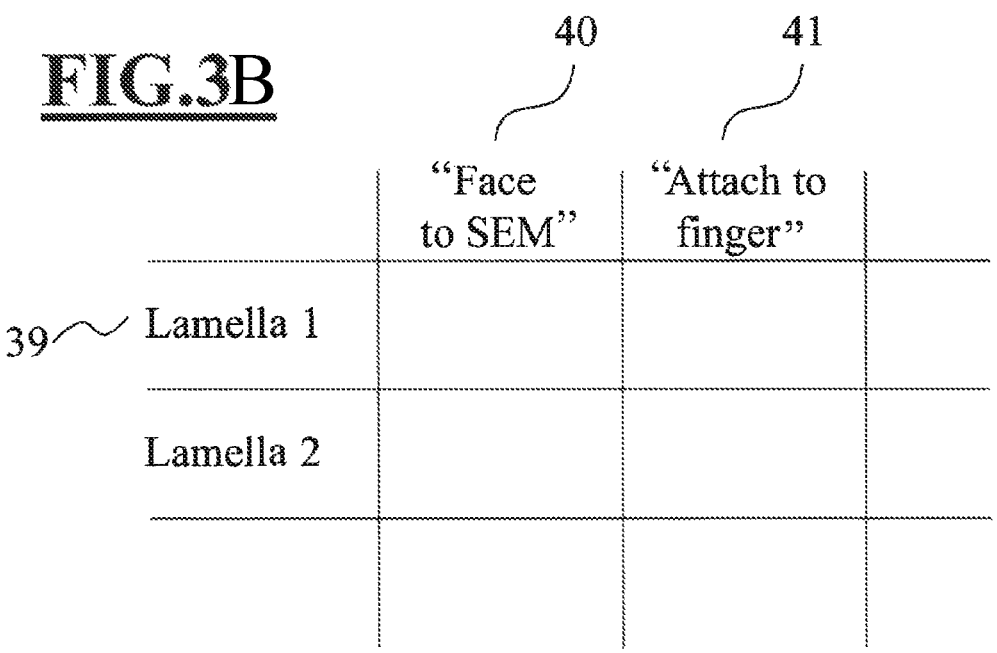

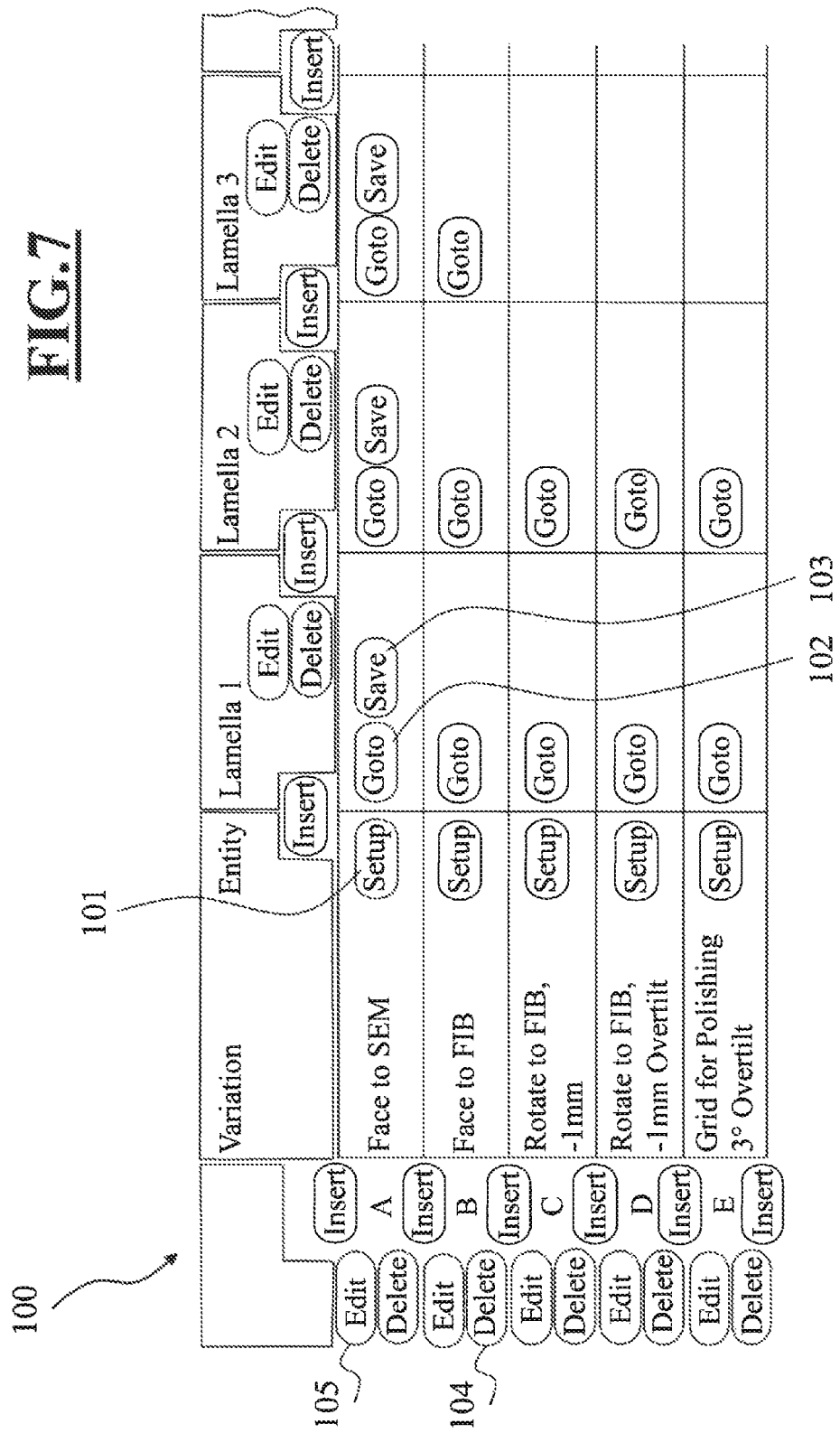

METHOD AND APPARATUS FOR POSITIONING MICROSCOPIC SPECIMENS WITH THE AID OF A TWO-DIMENSIONAL POSITION TABLE

CROSS-REFERENCE TO RELATED APPLICATIONS

The present application claims benefit under 35 USC 119 of German Application No. 10 2018 207 603.0, filed May 16, 2018. The entire disclosure of these applications are incorporated by reference herein.

FIELD

The disclosure relates to methods for positioning microscopic specimens in the specimen chamber of microscope systems, such as light microscopes or electron microscopes, for example.

BACKGROUND

Often, the areal extent of the specimen to be examined is so large that the region of interest (ROI) of the specimen cannot be arranged completely within the field of view of the microscope system used for the examination. Thus, the specimen is displaced in order to image or process the entire specimen. Moreover, there are instances where a plurality of specimen regions of interest (ROIs) are present on the same specimen. In this case, too, the specimen is displaced so that the specimen regions of interest (ROIs) can be brought successively into the field of view of the microscope system in order to be able to image or process the ROIs. Moreover, holding the specimen region of interest in various, precisely defined positions relative to the optical axes of the microscope system is often desired when preparing microscopic specimens. Hence, the navigation, i.e., the accurate positioning and retrieval of specimen regions of interest, plays an important role in microscopy and structuring issue.

In the case of microscopy systems whose operation is based on a beam of charged particles, such as electron microscopes or ion beam microscopes, for example, the specimen is usually assembled on a displaceable specimen stage. By way of example, this can be a five-axis stage, with the aid of which the specimen can be moved in the x and y spatial directions in such a way that it is held in the field of view of the microscope system. Moreover, the specimen—in particular the region of interest (ROI) —is held at a certain distance (z-height) from the objective lens such that the optical axis of the particle beam device extends approximately at right angles to the surface of the specimen and the region of interest (ROI) can be focussed.

Five-axis stages are often used in scanning electron microscopes (SEMs), ion beam microscopes or two-beam devices. A two-beam device is a combination device, which includes both an electron beam column and an ion beam column (focussed ion beam, FIB). Two-beam devices are often used to observe microscopic specimens with the aid of the electron beam column and to process these with the aid of the ion beam column. By way of example, a cross section can be produced or a TEM lamella can be prepared in a two-beam device. During such specimen preparations, the specimen is usually held in a plurality of different positions, i.e., in different locations and spatial orientations, specifically in such a way that, on the one hand, it can be imaged with the aid of the electron beam column and, on the other hand, it can be processed with the focussed ion beam (FIB).

Position lists, two-dimensional images or CAD data are usually used for positioning specimens; however, this is linked to a significant work and documentation outlay for the user.

It is well known that, for the purposes of positioning specimens during the specimen preparation, use is made of simple position lists that are editable by the user, in which the various positions that the specimen can adopt are listed. Usually, the specimen is initially moved manually into the desired positions in order then to store these in the position list. Then, the stored positions can be subsequently called in order to displace the specimen back into the relevant position. A disadvantage thereof is that this involved significant work outlay since all positions have to be approached manually and have to be documented individually by the user. Moreover, managing and processing long lists, which can be considered to be one-dimensional tables, can be very confusing.

Using graphical aids such as two-dimensional overview images or CAD layout data for navigation purposes is likewise known. Usually, the goal is to retrieve the specimen region of interest in two (x, y) or three dimensions (x, y, z). However, even in these methods, the user may find it difficult to orient themselves and to document the involved data, particularly if changes in three-dimensional coordinates or changes in the spatial orientation such as tilting and rotating of the specimen are intended to be taken into account.

SUMMARY

The present disclosure proposes methods by which a specimen to be examined can be positioned in a particle beam device in a user-friendly manner and by which the approach of predetermined specimen positions can be partly or wholly automated. This can allow the work and documentation outlay for the user to be relatively low and the input of incorrect or inapplicable position data to be avoided. For example, the positioning method according to the disclosure can be embodied as an intelligent method, i.e., as a self-learning method, which monitors the input of the data and provides the option of improving the positioning accuracy of the specimen stage In an exemplary aspect, the disclosure provides a method for positioning a specimen in a microscope system, wherein a region of interest (ROI) on the specimen is observed and/or processed using the microscope system. The microscope system includes: an optical or particle-optical system that defines an optical axis; a movable specimen stage for receiving a specimen, by which the specimen can be held in a first position and a second position relative to the optical axis of the microscope system; a memory apparatus for storing data records that describe the positions; and a control apparatus that controls the movement of the specimen stage with the aid of the stored data records. The method includes: holding a specimen region (ROI) in the first position; storing a first data record, by which the first position is described, wherein the first position is defined as independent position; storing a second data record, by which the second position is described, wherein the second position is linked to the independent position; and calling one of the stored data records such that the specimen stage is moved in such a way that the specimen region is held at the position that is described by the called data record.

In an exemplary aspect, the disclosure provides a microscope system that includes: an optical or particle-optical system that defines an optical axis; a movable specimen stage for receiving a specimen, by which the specimen can be held in a first and a second position relative to the optical axis of the microscope system, wherein the first position is describable by a first data record and the second position is describable by a second data record; a memory apparatus for storing the data records, wherein the data records are savable in a two-dimensional table; and a control apparatus that can control the movement of the specimen stage with the aid of the stored data records. The microscope system is configured to carry out a method that includes: holding a specimen region (ROI) in the first position; storing a first data record, by which the first position is described, wherein the first position is defined as independent position; storing a second data record, by which the second position is described, wherein the second position is linked to the independent position; and calling one of the stored data records such that the specimen stage is moved in such a way that the specimen region is held at the position that is described by the called data record.

In an exemplary aspect, the disclosure provides a microscope system that includes: an optical or particle-optical system that defines an optical axis; a movable specimen stage for receiving a specimen, by which a first region of the specimen can be brought into different locations and spatial orientations relative to the optical axis of the microscope system and by which a second region of the specimen can be brought into different locations and spatial orientations relative to the optical axis of the microscope system, wherein the different locations and spatial orientations of the first and second region on the specimen are respectively describable by different data records; a memory apparatus for storing data records; a control apparatus that controls the movement of the specimen stage with the aid of data records that are stored in the memory apparatus; and a user interface with a display apparatus, on which information items are displayable in fields of a two-dimensional table, wherein the fields in a first row or column of the two-dimensional table are assigned to the first region of the specimen and fields in a second row or column, parallel to the first row or column, are assigned to the second region of the specimen. Data records stored in the data memory apparatus are assigned to the fields of the two-dimensional table. The data records correspond to different locations and/or spatial orientations of the specimen relative to the optical axis. The data records that are assigned to the fields of the first row or column correspond to different locations and/or spatial orientations of the first region of the specimen relative to the optical axis. The data records that are assigned to the fields of the second row or column correspond to different locations and/or spatial orientations of the second region of the specimen relative to the optical axis. The control apparatus is embodied to move the specimen stage relative to the optical axis upon actuation of the user interface at a selected field of the two-dimensional table. The movement is carried out until the first or second region of the specimen assigned to the selected field assumes a location and/or spatial orientation relative to the optical axis that is described in the data record assigned to the selected field.

The disclosure is based, in part at least, on the realization that the specimen is displaced into various specimen positions during specimen preparations, the positions being related to one another. The respective relationship between two positions can arise on account of the spatial conditions (specimen and/or device geometry) or can be arbitrarily assigned by the user. The specimen positions are often approached successively in a defined sequence, wherein some positions may be approached multiple times.

In any case, the knowledge about the relationship of the mutual dependencies of the individual specimen positions can be used to improve methods for the specimen positioning.

A specimen position (also abbreviated to "position") includes both the location and the spatial orientation of the specimen. Here, the phrase location means the localization of the specimen in three-dimensional space, which can be described by specifying x-, y- and z-coordinates. The spatial orientation is understood to mean the alignment of the specimen. The spatial orientation is usually specified in relation to one of the optical axes of the microscope system. The geometric configuration of the specimen and/or the desired processing steps mean that the specimen is held in certain alignments relative to the optical axis or axes of the microscope system.

Usually, the spatial orientation of the specimen is modified by rotating the specimen about the tilt and/or rotational axes. Here, it is often desirable to align the tilt axis of the specimen in such a way that the specimen is tilted as desired by the individual processing geometry.

The phrase positioning is understood to mean the movement of a specimen into a specimen position. Here, the route, by way of which the specimen is moved from a first position into a second position, also plays a role in some cases. The route is understood to mean the precise displacement path, i.e., sequence, speed and extent of translational movements (displacement steps) and rotational movements (tilt, rotation).

The movement of the specimen into the various positions is usually effected by way of a displaceable specimen stage. The specimen stage usually includes at least translational movement elements, by which it can be moved in the x- and y-direction, and usually also in the z-direction. Here, the aforementioned translation axes are oriented at right angles to one another in each case. The specimen stage often also includes rotational movement elements, which have, e.g., a first axis of rotation (R), about which the specimen stage is arranged in rotatable fashion. It is also conceivable for the stage to additionally have a second axis of rotation (T), about which it is rotatable and which is arranged at right angles to the first axis of rotation. The second axis of rotation is also referred to as a tilt axis (T). If use is made of such a five-axis stage, the specimen to be examined thus can be displaced in the three spatial directions x, y and z in order to change the location of the specimen. Moreover, the spatial orientation of the specimen can be modified by virtue of the specimen being rotated and/or tilted. It is also conceivable for the specimen stage to be embodied as a six-axis stage (a so-called super-eucentric stage), i.e., as a five-axis stage that has an additional axis, which is usually referred to as M-axis.

A control apparatus controls the movement of the specimen stage. Advantageously, this is implemented in computer-based fashion by the interaction of the control apparatus with a memory apparatus. The desired positions of the specimen region of interest can be described by data records and can be stored via the memory apparatus. For the purposes of approaching a certain specimen position, the relevant data record is called from the memory such that the control apparatus moves the specimen stage together with the specimen into the position described in the data record.

A data record is understood to mean data that are assigned to a specimen position and include the information with which the specimen position can be sufficiently characterized, for example the x-, y- and z-coordinates and the tilt angle of a certain specimen.

According to the disclosure, data records that describe the individual specimen positions are displayed in a two-dimensional table, i.e., in a matrix structure. Additional information can be conveyed by the arrangement within the matrix.

By way of example, it is possible to convey the information that all data entries of one column apply to the same specimen. Moreover, it is possible to link the information that all data entries in a certain row describe the same spatial orientation of the respective specimens relative to an optical axis of the microscope system. Expressed differently: Relationships between the data records are represented by the use of a two-dimensional table. This facilitates a partial or complete automation of the specimen positioning.

Proceeding from a freely chosen specimen position, which is defined to be independent, it is possible to calculate, in advance, or manually assign dependent positions. Here, the relationship between the independent position and a dependent position can be described, for example, by a fixed value or by a mathematical function.

It may be particularly advantageous if the relationships between the specimen positions are stored as relative links so that a change in position results in the change of the other linked positions.

It is also conceivable for specimen positions to be ascertained by logical analogical conclusions.

Proceeding from specimen positions of a first specimen region of interest, the corresponding positions for a second specimen region can be calculated in an analogous fashion.

Consequently, the specimen positioning can be standardized during preparations by virtue of all specimen positions for a first specimen region of interest (ROI) initially being stored. Then, the specimen positions for other specimen regions of interest (ROIs) or specimen alignments can be derived in an analogous fashion from the stored data. This is advantageous in that only a few specimen positions have to be entered manually by the user and the plurality of the specimen positions can be calculated via the computer-based control apparatus.

Moreover, it is possible to define a management logic which, in the form of rules, determines whether or not certain locations and spatial orientations should be admissible as a specimen position.

It is also conceivable that predetermined commands are provided in a command list, from where they can be selected and assigned to a data record and/or a field in the two-dimensional table. A specimen stage can be moved with the aid of a command such that a specimen region of interest is moved from a first specimen position into a second specimen position.

Exemplary embodiments of the disclosure are explained below on the basis of figures. Therefore, the entire respectively preceding and subsequent description is referred to as well for the purposes of explaining the components.

BRIEF DESCRIPTION OF THE DRAWINGS

FIG. 2 shows a flowchart of a first exemplary embodiment of the method according to the disclosure.

FIG. 3A shows a two-dimensional position table in exemplary fashion.

FIG. 3B shows an alternative two-dimensional position table in exemplary fashion.

FIG. 7 shows an example of a two-dimensional position table that is embodied as a graphical user interface.

DISCLOSURE OF EXEMPLARY EMBODIMENTS

Figure 1:
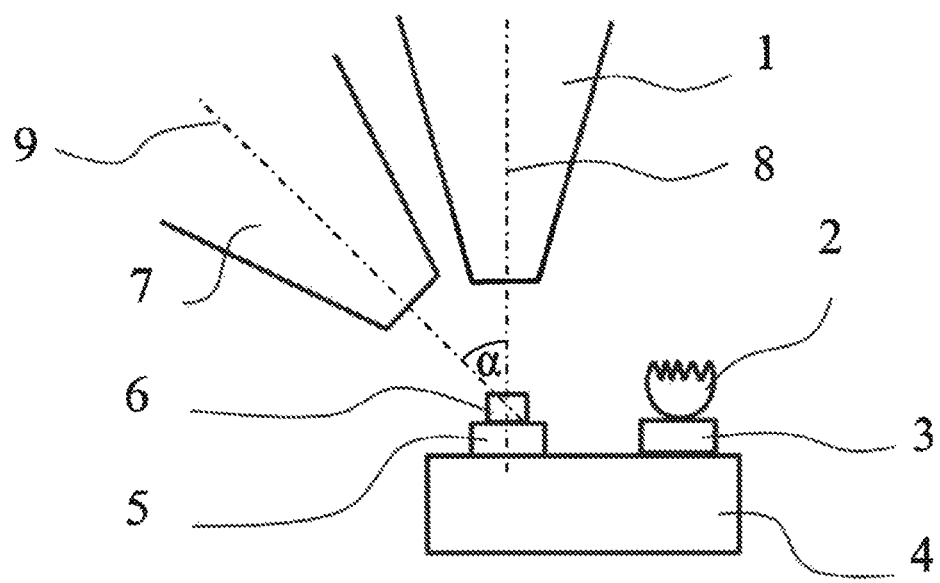
FIG. 1 shows the situation in a particle beam device that is configured to carry out an exemplary embodiment of the positioning method.

FIGS. 1 and 2 relate to a first exemplary embodiment of the positioning method according to the disclosure, as may be used in TEM lamella preparation.

TEM lamellas are microscopic specimens that are used for the examination in a transmission electron microscope (TEM). At least in one portion, TEM lamellas are so thin that they can be passed through by electrons such that transmitted electrons can be detected and used for image generation. Conventionally, a TEM lamella is prepared from the entire specimen material, i.e., a specimen block. During the so-called lift-out, the TEM lamella is separated from the specimen block and transferred to a transfer holder.

FIG. 1 schematically shows the situation in the specimen chamber of a two-beam device, in which a specimen block 6 and a transfer holder 2 are positioned in the course of preparing a TEM lamella.

A specimen block 6 including a spatial region that should be prepared as a TEM lamella is assembled on a specimen holder 5. A transfer holder 2 is held on a further specimen holder 3. Both specimen holders 3, 5 are held on a displaceable specimen stage 4, which is preferably embodied as a five-axis stage.

The transfer holder 2 serves to receive the TEM lamella, which has been separated from the specimen block 6, and to keep the latter available for further use. By way of example, the transfer holder 2 can be embodied as a lift-out grid.

The specimen stage 4 with the above-described elements assembled thereon is situated in the specimen chamber of a two-beam device, which has an electron beam column 1 and an ion beam column 7. The two-beam device moreover includes a memory apparatus (not illustrated) and a control apparatus (not illustrated). The specimen stage 4 can be moved using the control apparatus, allowing the specimen stage 4 and the elements assembled thereon to be displaced into predetermined positions. Thus, the specimen block 6 and the transfer holder 2 can be held in different positions relative to the optical axes 8, 9 of the particle beam device by way of moving the specimen stage 4.

FIG. 2 shows a flowchart of the first exemplary embodiment of the positioning method according to the disclosure. Here, the specimen stage of the two-beam device is loaded with a specimen block, from which a first TEM lamella should be obtained, and with a transfer holder in step S1. Conventionally, a specimen stage includes a plurality of receptacle apparatuses for specimen holders. The specimen holder, which carries the specimen block, is assembled on one of the receptacle apparatuses. The transfer holder (which, in principle, is likewise a specimen holder) is assembled on a second receptacle apparatus, the first TEM lamella being intended to be transferred onto the transfer holder after separation from the specimen block.

In step S2, the specimen block is imaged with the aid of the scanning electron microscope function of the two-beam device. To this end, the specimen block is positioned via the control apparatus in such a way that the specimen block is aligned substantially at right angles to the optical axis of the electron beam column. This means that the electron beam strikes the specimen surface at approximately right angles. Here, it is advantageous if the working distance (z-height) is chosen in such a way that good imaging properties are obtained.

Then, a specimen region of interest (ROI) at which the first TEM lamella is intended to be prepared is selected on the basis of the image of the specimen (step S3). It may be desirable to displace the specimen in the x- and y-direction until the specimen region of interest (ROI) is placed under the objective lens of the electron beam column in such a way that the specimen region of interest (ROI) lies as desired in the field of view of the electron beam column.

The current position of the first specimen region (ROI) is stored in the next step S4. Here, a first data record is stored, the first data record describing both the location and the spatial orientation of the first specimen region (ROI). The data record with the involved information can be displayed in a two-dimensional table with the aid of the memory apparatus.

The specimen position of the first specimen region (ROI), stored in step S4, is advantageously defined as an independent position and stored as such. An independent position can be freely chosen. Within the course of the method, other specimen positions can then be assigned to the independent position. In other words: Further positions are linked to the independent position such that the assigned positions are considered to be dependent on the independent position. Advantageously, the data record is provided with a unique and characterizing label, for example "Face to SEM", such that further processing is made easier.

In the next step S5, the transfer holder is imaged with the aid of the scanning electron microscope. To this end, the specimen stage is moved in such a way that the transfer holder is placed under the objective lens of the electron beam column.

A first specimen receiving region is selected in step S6 on the basis of the SEM image, specifically the region on the transfer holder to which the first TEM lamella should be transferred in the subsequently implemented lift-out.

The position of the first receiving region is linked to the "Face to SEM" first specimen position and stored (step S7). Advantageously, the position is saved together with a suitable label, e.g., "Attach to grid finger", and is presentable in a two-dimensional table. It is particularly advantageous if this is carried out in such a way that the link becomes identifiable from the arrangement in the table. By way of example, this is the case if the data records that are linked to one another are saved in different rows of the same column (as illustrated in FIG. 3A), with all fields in this column relating to the first TEM lamella and the entries in these fields representing various specimen positions of the first TEM lamella.

If desired, it is now possible to define and store even further specimen positions. To this end, the desired positions can be approached and stored manually.

Alternatively, further desired specimen positions can be ascertained and stored via calculation operations—proceeding from the independent position to which they are linked.

Should a second TEM lamella be intended to be processed, method steps S2 to S8 are repeated for the second TEM lamella.

Finally, in step S9, a specimen position stored in a data record is called such that the specimen stage is moved by the interaction of memory apparatus and control apparatus.

The stage movement is implemented in such a way that the specimen region is displaced to, and held at, the position described by the called data record. Thus, that is to say that the specimen region adopts a predetermined location and a predetermined spatial orientation with respect to the microscopy system, preferably with respect to an optical axis of the microscopy system.

Thus, the method according to the disclosure allows a specimen region that is situated at any position to be displaced in such a way that the specimen region is moved to another, previously ascertained position.

FIGS. 3A and 3B show what a two-dimensional table, in which the data records are displayed, can look like. FIG. 3A illustrates that the fields 33, 34, 35, 36 of the table are arranged in columns 31, 32 and rows 37, 38. All fields of column 31 are assigned to a certain specimen, for example the first TEM lamella (lamella 1). The data records for individual positions for this specimen are respectively stored in rows 37, 38 of column 31. This means that the data records for all specimen positions that the specimen is intended to adopt during the preparation of the first TEM lamella are stored in column 31.

Naturally, it is also conceivable for the dimensions of the table to be reversed, as illustrated in FIG. 3B. Here, the data of a certain specimen (e.g., lamella 1) are arranged in a row 39. The specimen positions belonging to this specimen are stored in the various columns 40, 41.

What is common to both variants of FIGS. 3A and 3B is that the data records are presented in a matrix structure. What is particularly advantageous here is that the relationship of the data records among themselves is represented, i.e., reproduced, by the arrangement in the two-dimensional table. Hence, in contrast to a position list, laborious labelling can be dispensed with. The relationship between the data entries in the individual fields 33, 34, 35, 36 can either be assigned manually or arise from calculations.

In the exemplary embodiments described above and in the following text, it is also conceivable, in principle, for raw data, i.e., the data in respect of location and spatial orientation, to be stored in the data records that describe the independent specimen positions. Storing is implemented together with information relating to the relationships, by which the dependent positions are linked to the independent positions. Thus, that is to say that the raw data are stored with a management logic. This is advantageous in that only small data volumes need to be stored. The calculation of the dependent specimen position to be approached is only implemented when reading the data, i.e., when the specimen should be moved to a certain specimen position. Consequently, the precise data of the dependent specimen positions in respect of their location and spatial orientation are only ascertained "on-the-fly".

Figure 4:
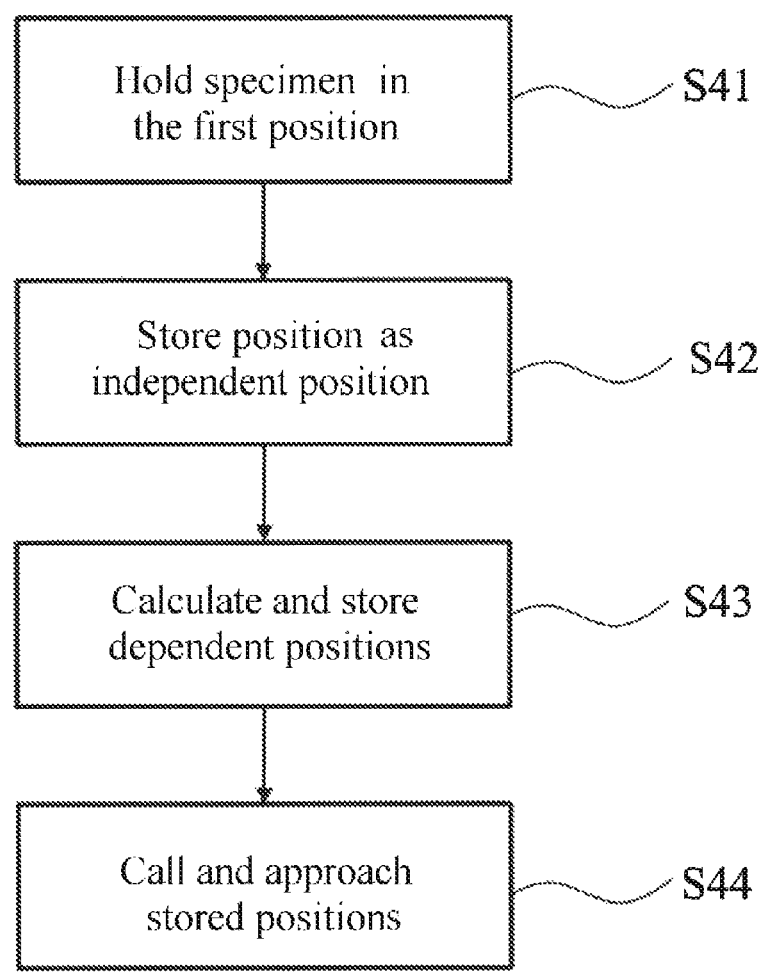
FIG. 4 shows a flowchart of a second exemplary embodiment of the method according to the disclosure.

In a further exemplary embodiment, which is explained on the basis of FIG. 4, the method according to the disclosure is used to navigate specimens in the specimen chamber of a two-beam device when preparing a specimen cross section. Preparing a specimen cross section may be part of the preparation of a TEM lamella.

A specimen cross section is a polished surface that extends at right angles to the specimen surface. For the purposes of producing a cross section, the specimen is usually initially imaged with the aid of the scanning electron microscope, with the region on the specimen at which the cross section is intended to be produced being set.

For this purpose, the specimen is held under the objective lens of the electron-optical column in such a way that the specimen surface is aligned at approximately right angles to the optical axis of the electron-optical column. By way of example, this specimen position is labelled "Face to SEM". Then, specimen material is ablated (milled) using the focussed ion beam until the cross-sectional area is exposed. In this processing step, the specimen is held under the objective lens of the ion-optical column, specifically such that the specimen surface is aligned at approximately right angles to the optical axis of the ion-optical column (specimen position: "Face to FIB").

Advantageously, the specimen is moreover rotated in the process so that the tilt axis of the specimen is aligned parallel to the longitudinal extent of the cross section (specimen position: "Rotate Face to FIB"). In principle, (depending on specimen geometry and geometry of the employed microscope system,) the processing geometry may involve that the specimen is rotated in a certain way in order to be able to carry out the involved processing steps.

In order to preclude a collision between specimen and microscope system, it is often desirable to hold the specimen at an increased distance, for example at a distance from the objective lens of the particle-optical apparatus that has been increased by 1 mm. To this end, a further position that meets these criteria can be defined (specimen position: "Face to FIB−1 mm").

As already mentioned above, specimen material is ablated using the focussed ion beam in order to produce a cross section. However, on account of the shape of the beam profile of the focussed ion beam, the cross section produced thus mostly does not extend exactly at right angles to the specimen surface. Therefore—depending on conditions— the specimen still is tilted in a slightly more pronounced or less pronounced fashion such that post-processing can be carried out with the ion beam under a modified angle of incidence (specimen position: "Rotate to FIB overtilt"). This allows a cross-sectional area, which is aligned at right angles to the specimen surface, to be produced. Finally, the specimen is brought into a position in which the cross section can be imaged in the scanning electron microscope. Here, it is advantageous if the specimen is tilted through an angle of 60° between the optical axis of the electron-optical column and the cross section (specimen position: "Face to SEM 60°").

Thus, the specimen is successively moved into various positions relative to the optical axis of the electron-optical column and the optical axis of the ion-optical column, and held in these positions, during the course of a cross section preparation. On account of the geometric conditions of the two-beam device, there are logical relationships in each case between the individual positions of this position sequence, which can be formulated mathematically. By way of example, the two beam columns are arranged at a certain angle $\alpha$ relative to one another. Therefore, proceeding from a first specimen position that is defined as independent position, it is possible to ascertain further positions with the aid of calculation operations and link the further positions to the first specimen position.

By way of example, the "Face to SEM" position, in which the specimen is held at right angles to the optical axis of the SEM column in the focal plane without tilt, can be chosen as independent position. As illustrated in FIG. 4, the specimen is initially brought into this position in step S41 in order to be able to image it with the SEM. It is advantageous if the positioning is implemented while SEM recordings are being produced so that the exact position of the specimen can be set and monitored.

Then (step S42), the position found in step S1 is stored as independent position. It may be particularly user-friendly if the position is presented in a two-dimensional position table (like FIG. 5).

Dependent positions are calculated and stored in step S43 and, for example, saved row-by-row in the two-dimensional table. Here, the "Face to FIB" position can be calculated as a dependent position without this position having to be approached manually to this end. The electron-optical column and the ion-optical column are arranged in a fixed angle $\alpha$ in relation to one another, for example at an angle of 54°. In order to displace the specimen from the "Face to SEM" specimen position into the "Face to FIB" position, the specimen is rotated about the tilt axis through the angle $\alpha$. If the site and space coordinates of the "Face to SEM" position are known and stored, it is consequently possible to calculate the site and space coordinates of the "Face to FIB" position.

Thus, derived specimen positions, which are involved for the respective specimen preparation, can be calculated from a freely chosen position. Here, in principle, any specimen position of the position sequence can be set as independent position since the links are usually reversible.

In some cases, it may be desirable to rotate the specimen prior to processing. Here, it was found to be particularly advantageous to superimpose a processing object (overlay) into the SEM image of the specimen with the aid of the microscope operating software and to ascertain the desired angle of rotation on the basis of this presentation.

In step S44, stored positions are called such that the specimen is displaced into the previously set locations and spatial orientations.

Figure 5:
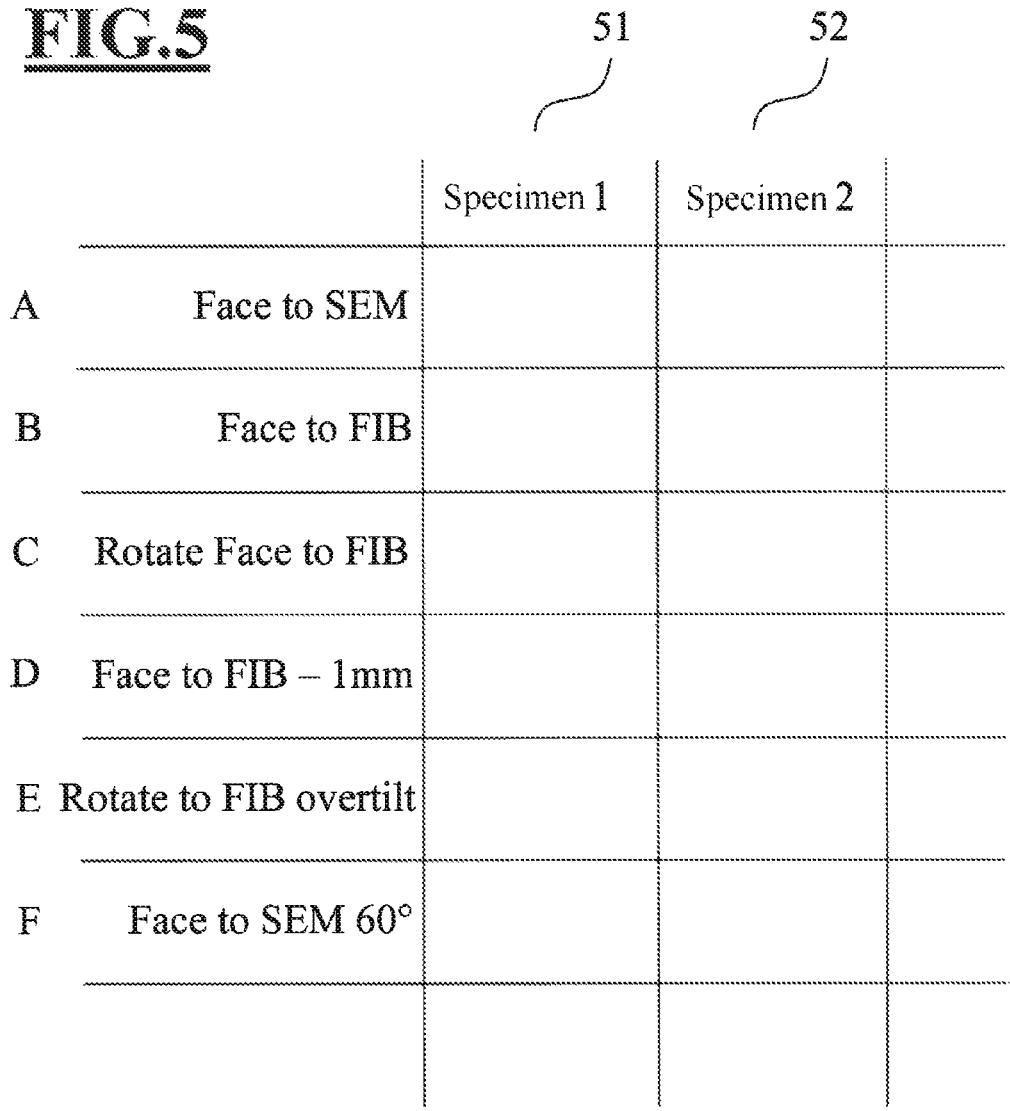
FIG. 5 shows a specific manifestation of a two-dimensional position table.

FIG. 5 shows a two-dimensional position table with the specimen positions of the second embodiment in exemplary fashion. The individual specimen positions are saved in the table row-by-row. If a plurality of cross sections are intended to be produced, the table can be designed with a plurality of columns 51, 52, wherein the definitions and rules of the individual fields of the first column can be adopted in analogous fashion in the fields of the other columns.

It is particularly advantageous if the data records in the two-dimensional table are editable. Consequently, rules can be recorded, which simplify the specimen positioning and make this more reliable. By way of example, it may be recorded that only those specimen positions that were defined manually by the user or that can be calculated completely are allowed to be approached. It is also conceivable for the user to enter a safety margin between specimen and objective lens by way of the definition of rules. By way of example, this is implemented by virtue of the distance between specimen and objective lens in the z-direction being increased by 1 mm. Further, it is conceivable that rules for the relationship between individual rows or columns are formulated and stored.

Moreover, it is possible to avoid storing positions that are obviously incorrect, for example by virtue of preventing the position at right angles below the objective lens of the electron-optical column from being stored as "Face to FIB". This can avoid confusion and reduce the risk of damage when moving the specimen.

Moreover, the route along which the specimen stage is displaced in order to move the specimen region of interest (ROI) to a specific position can be set in the form of rules. That is to say, the displacement path is set. By way of example, this is implemented by defining what stage axes are moved, and to what extent and in which sequence this is implemented.

It is also conceivable that rules that define a relationship between a specimen position and an operating parameter of the particle beam device, for example the set beam current of the particle beam, are formulated.

Finally, rules can also be recorded in context-dependent fashion such that these rules are applied depending on a very specific process step. By way of example, if a position for a polishing step is approached with overtilt, the rotation of the specimen is to be chosen correctly. However, if the same position is approached in order to record a control image, the rotation can be neglected.

Moreover, it is possible to provide a correction option, with the aid of which the accuracy of the positioning can be improved. Since the displacement accuracy of the specimen stage is limited, it is often desirable for the user to be able to check approached positions and manually correct these where desired. Therefore, provision can be made for the previously stored position to be overwritten by the corrected specimen position after such a manual correction. This may be implemented automatically, e.g., triggered by the start of a milling process or the start of a deposition process. It is also conceivable for the correction of the positioning to be brought about with the aid of an automatic drift correction. In this case, too, the previously stored position can be overwritten by the corrected specimen position.

FIG. 7 shows a particularly advantageous embodiment, in which the two-dimensional position table is embodied as a graphical user interface 100. Here, it is conceivable that the operation is implemented via buttons 101, 102, 103, 104, 105, by which the user can carry out commands such as "Produce data record (Setup)" 101, "Store data record (Save)" 103, "Process data record (Edit)" 105, "Approach specimen position (Goto)" 102 and "delete data record (Delete)" 104. Further buttons may be provided. It is particularly advantageous if a dialogue box, in which the user can edit the data record, is opened upon actuation of the "Produce data record (Setup)" 101 and/or "Process data record (Edit)" 105 buttons. By way of example, relationships between rows of the two-dimensional table can be specified in the Setup- or Edit-dialogue.

By way of example, the relationship between row B and row C in FIG. 5 may be: z (C)=z (B)−1 mm, in order to ensure a distance from the particle beam column that has been increased by 1 mm. Moreover, further conditions can be specified in the dialogue box, for example for row A and row B in FIG. 5. In this example, this may be: B=A+ compucentric tilt according to T=54°, if the angle α between the beam columns is 54°.

Figure 6:
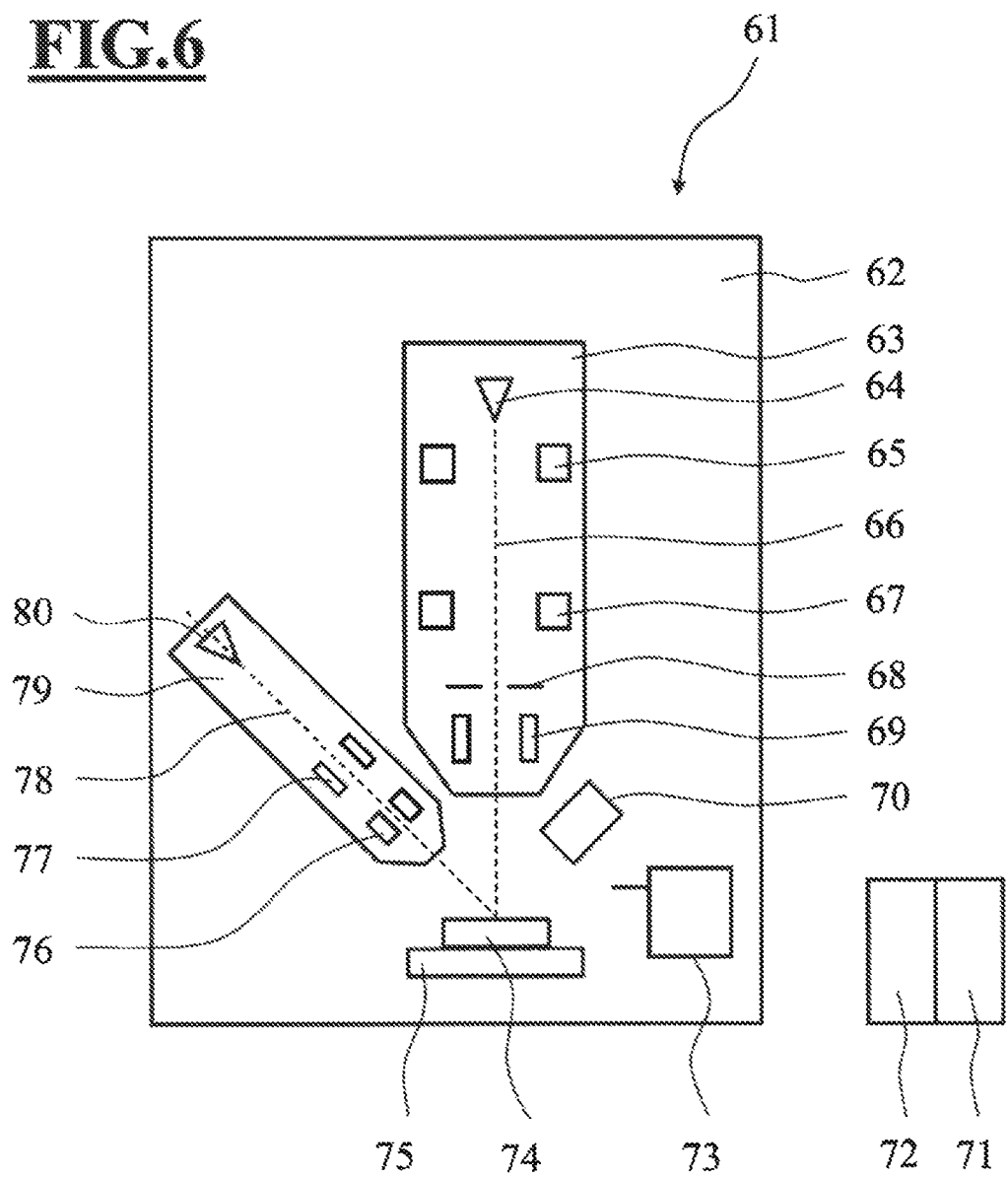
FIG. 6 shows a particle beam device with which the positioning method can be carried out.

The various embodiments of the method according to the disclosure can be carried out, for example, using a two-beam device (FIB-SEM combination device); FIG. 6 shows a two-beam device 61 including two particle beam columns, specifically an electron beam column 63 for producing an electron beam and an ion beam column 79 for producing a focussed ion beam. Both particle beams are directed to the processing site on the specimen 74, which is usually situated at the coincidence point of both particle beams. The specimen 74 is held on the displaceable specimen stage 75 via a specimen holder (not illustrated) and the specimen is situated in the specimen chamber 62 of the two-beam device, in which vacuum conditions usually prevail during operation.

The specimen stage 75 is advantageously configured as a five-axis specimen stage. That means that the specimen 74 can be moved in the x-, y- and z-directions—that is to say in three mutually perpendicular spatial directions—and can be rotated about a tilt axis and an axis of rotation. The rotation about the tilt axis, which extends at right angles to a plane spanned by the optical axes 66, 78 (i.e., perpendicular to the plane of the drawing), renders it possible to allow the surface of the specimen, which is intended to be irradiated by charged particles, to adopt different adjustable angles in relation to the optical axes 66, 78.

During operation, primary electrons are produced in the electron source 64, the primary electrons being accelerated along the optical axis 66 of the electron beam column 63, focused by the lens systems 65, 67 and trimmed by at least one aperture stop 68. Moreover, the electron beam column 63 includes a deflection system 69, by which the primary electron beam can be guided over the surface of the specimen 74. Further, the FIB-SEM combination device 61 includes at least one detector 70 for detecting interaction products of the interaction between particle beam and specimen 74.

Moreover, the two-beam device 61 includes an ion beam column 79 with an ion source 80, a deflection system 77 and a focusing lens element 76. The ions produced in the ion source 80 are accelerated along the optical axis 78 of the ion beam column 79 and focused such that the ions are incident on the specimen 74 in focus and can be used to ablate material from the specimen 74 and/or image the specimen 74.

It is advantageous if the particle beam device further has a gas injection system (GIS) 73. The latter usually includes at least one reservoir for a process gas which can be supplied to the specimen 74 via a line that ends near the processing site. The process gas can be embodied as precursor gas. The precursor gas is initially activated by the ion beam or the electron beam and thus converted into a reactive form that is able to ablate specimen material or deposit material at the specimen 74. By way of example, a precursor gas of xenon difluoride ($XeF_2$) can be supplied, which is converted into reactive xenon difluoride by the activation such that the specimen material is etched. The processing progress of the specimen 74 can be simultaneously or successively observed with the aid of the electron beam column 63 and a detector 70.

Moreover, the particle beam device 62 includes a control apparatus 72 and a memory apparatus 71. Data records, which describe the specimen positions and are used for positioning the specimen according to the disclosure, can be stored and processed with the aid of the memory apparatus 71. As a result of an interaction between the memory apparatus 71 and control apparatus 72, it is possible to displace the specimen stage in such a way that a specimen region of interest (ROI) is moved into, and held at, a predetermined position.

The control apparatus 72 can carry out a sequence of control commands included in a computer program. As a result of carrying out the sequence of control commands, the particle beam device 61 is prompted to carry out the positioning method according to the disclosure.

The positioning method according to the disclosure is not restricted to the shown exemplary microscope systems. It is likewise conceivable to use the method according to the disclosure when observing and/or processing specimens that are intended to be examined using other microscopy systems, for example using light microscopes or x-ray microscopes.

It is particularly advantageous to carry out the method according to the disclosure using a microscope system having an optical or particle-optical system that defines an optical axis and having a movable specimen stage for receiving a specimen.

With the aid of the specimen stage, a first region of the specimen can be brought into different positions, i.e., that is to say locations and spatial orientations, relative to the optical axis of the microscope system. Likewise, a second specimen region can be moved into different positions relative to the optical axis. The locations and spatial orientations of the first and second specimen region can be described by different data records in each case. Moreover, the microscope system includes a memory apparatus for storing data records and a control apparatus that controls the movement of the specimen stage, which is brought about with the aid of the stored data records. Moreover, the microscope system includes a user interface with a display apparatus, on which information is displayable in fields of a two-dimensional table.

Here, the fields in a first row or column of the two-dimensional table are assigned to the first specimen region. Moreover, the two-dimensional table has at least one second column or row, which extends parallel to the first column or row. The fields of the second column or row are assigned to the second region of the specimen. Data records are assigned to the fields, the data records being stored in the data memory apparatus and corresponding to the different locations and/or spatial orientations of the specimen regions relative to the optical axis. Consequently, a position (i.e., location and spatial orientation) of a specimen region is assigned to the table fields in each case.

Here, the data records, which are assigned to the fields of the first row or column, correspond to the locations and spatial orientation that the first specimen region can adopt relative to the optical axis. The data records, which are assigned to the fields of the second row or column, correspond to the positions that the second specimen region can adopt relative to the optical axis.

It is particularly advantageous if the control apparatus is embodied in such a way that positions described by the stored data records can be approached by way of an input on the user interface. By way of example, the specimen stage can be moved by clicking on, or otherwise selecting, a selected field in the two-dimensional table. To this end, the data record assigned to the selected field is resorted to. The specimen region assigned to the field is moved until it adopts the location and spatial orientation relative to the optical axis described in the associated data record.

Moreover, it is conceivable that—proceeding from the specimen positions of a first specimen region of interest—specimen positions of a second specimen region are ascertained and calculated by analogical conclusions. To this end, the user interface should be embodied in such a way that commands can be allocated to the stored data records. Here, the data records are each assigned to a field which, in turn, is allocated to a first or second region of the specimen. Here, the control apparatus can calculate and assign an associated data record for a field assigned to the second region of the specimen, wherein the calculated data record corresponds to the command that is allocated to the field. A command is based on relationship knowledge about the relationship between a first and a second specimen position and the command supplies information as to how the specimen stage is moved in order to move the specimen region from the first specimen position to the second specimen position.

When calculating the data record, a stored data record assigned to the second specimen region is taken into account in another field, which is assigned to the second region.

Moreover, a stored data record is taken into account when calculating the data record, the stored data record being assigned to the first region of the specimen which is assigned to a field that is allocated the same command as the field for which the data record should be calculated and assigned.

Moreover, it is conceivable that the user interface of the microscope system is embodied to assign commands from a command list to the fields that are assigned to the first specimen region and/or to the fields that are assigned to the second specimen region. To this end, the control apparatus is embodied in such a way that an associated data record can be calculated and allocated to a selected field, the data record corresponding to the command assigned to the selected field. When calculating the data record, a stored data record is taken into account, the stored data record being assigned to another field that is assigned to the same region of the specimen.

LIST OF REFERENCE SIGNS

1 Electron beam column
2 Transfer holder
3 First specimen holder
4 Specimen stage
5 Second specimen holder
6 Specimen block
7 Ion beam column
8 Optical axis of the electron beam column
9 Optical axis of the ion beam column
S1 Step 1
S2 Step 2
S3 Step 3
S4: Step 4
S5: Step 5
S6: Step 6
S7: Step 7
S8: Step 8
S9: Step 9
31 First column
32 Second column
33 First field
34 Second field
35 Third field
36 Fourth field
37 Second row
38 First row
39 Row
40 First column
41 Second column
S41 Step 1
S42 Step 2
S43 Step 3
S44 Step 4
51 First column
52 Second column
61 Two-beam device
62 Specimen chamber
63 Electron beam column
64 Electron source
65 First condenser lens element system
66 Optical axis of the electron beam column
67 Second condenser lens element system
68 Aperture stop
69 Deflection system
70 Detector
71 Memory apparatus
72 Control apparatus
73 Gas injection system
74 Specimen block
75 Specimen stage
76 Focusing lens element
77 Deflection system
78 Optical axis of the ion-optical column
79 Ion-optical column 80 Ion source
100 Graphical user interface
101 Setup button (Produce data record)
102 Goto button (Approach specimen position)
103 Save button (Store data record)
104 Delete button (Delete data record)
105 Edit button (Edit data record)

What is claimed is:

1. A method of using a microscope system which comprises: an optical or particle-optical system defining an optical axis; a movable specimen stage configured to hold a region of interest on the specimen in a first position relative to the optical axis and to hold the region of interest on the specimen in a second position relative to the optical axis; memory configured to store data records that describe positions of the specimen in a two-dimensional table; and a control apparatus configured to control movement of the movable specimen stage with the aid of the stored data records in the two-dimensional table, the method comprising:

using the microscope system to hold the region of interest on the specimen in the first position;
storing in the memory a first data record of the two-dimensional table, the first data record defining the first position of the region of interest on the specimen in three mutually perpendicular spatial directions, and the first data record defining a spatial orientation of the region of interest on the specimen in the first position;
storing in the memory a second data record of the two-dimensional table, the second data record defining the second position of the region of interest on the specimen in the three mutually perpendicular spatial directions, and the second data record defining a spatial orientation of the region of interest on the specimen in the second position, wherein the second position is linked to the first position; and
calling the second data record from the two-dimensional table so that the movable specimen stage is moved so that the region of interest on the specimen is held at the second position.

2. The method of claim 1, further comprising, based on the stored data records, using the movable specimen stage to move the specimen between the first and second positions.

3. The method of claim 1, further comprising using the optical or particle-optical system to provide a beam of charged particles to process the specimen.

4. The method of claim 3, wherein the charged particles comprise electrons.

5. The method of claim 3, wherein the charged particles comprise ions.

6. The method of claim 1, further comprising calculating the second position based on the first position without manually approaching the second position.

7. The method of claim 1, further comprising determining the second position by manually approaching the second position based on the first position.

8. The method of claim 1, further comprising using a graphical user interface to display the two-dimensional table.

9. The method of claim 1, wherein the data records are editable.

10. The method of claim 1, further comprising recording a rule, wherein the rule defines a management logic between two positions of the region of interest on the specimen so that the region of interest on the specimen is positionable only in those positions that are allowed according to the rule.

11. The method of claim 1, wherein:
the movable specimen stage comprises at least two axes;
movement of the movable specimen stage is defined by a sequence, speed and extent of the movement of the axes; and
the method further comprises recording a rule that prescribes the sequence, speed and extent to which the axes are moved to position the specimen.

12. The method of claim 1, further comprising improving the accuracy of positioning the region of interest on the specimen by storing a corrected position when the specimen position is corrected.

13. One or more machine-readable hardware storage devices comprising instructions that are executable by one or more processing devices to perform operations comprising the method of claim 1.

14. A microscope system, comprising:
an optical or particle-optical system defining an optical axis;
a movable specimen stage configured to hold the specimen in a first position relative to the optical axis and in a second position relative to the optical axis, the first position being describable by a first data record and the second position being describable by a second data record;
memory configured to store data records that describe positions of the specimen, the data records being saveable in a two-dimensional table; and
a control apparatus configured to control movement of the movable specimen stage with the aid of the stored data records,
wherein the microscope system is configured to perform a method of positioning the specimen, the method comprising:
holding a specimen region of interest in the first position;
storing in the memory a first data record, by which the first position is defined in three mutually perpendicular spatial directions and a spatial orientation, in a two-dimensional table;
storing in the memory a second data record, by which the second position is defined in three mutually perpendicular spatial directions and a spatial orientation, in the two-dimensional table, wherein the second position is linked to the first position; and
calling the second stored data record from the two dimensional table so that the movable specimen stage is moved so that the specimen region is held at the second position.

15. A microscope system, comprising:
an optical or particle-optical system defining an optical axis;
a movable specimen stage configured to hold the specimen, by which a first region of the specimen can be moved into different locations and spatial orientations relative to the optical axis of the microscope system and by which a second region of the specimen can be moved into different locations and spatial orientations relative to the optical axis of the microscope system, wherein the different locations and spatial orientations of the first and second region on the specimen are respectively describable by different data records;
memory configured to store data records that describe positions of the specimen, the data records comprising a first data record for a first position of the specimen, the first position of the specimen being defined as an independent position, the other data records being for positions of the specimen which are linked to the independent position, the data records being saveable in a two-dimensional table;

a control apparatus configured to control movement of the movable specimen stage with the aid of the stored data records; and a user interface comprising a display apparatus on which information is displayable in fields of a two-dimensional table, wherein:

the fields in a first row or column of the two-dimensional table are assigned to the first region of the specimen and fields in a second row or column, parallel to the first row or column, are assigned to the second region of the specimen;

data records stored in the memory are assigned to the fields of the two-dimensional table;

each data record defines a corresponding position of the specimen in three mutually perpendicular spatial directions and defines a corresponding spatial orientation of the specimen relative to the optical axis;

the data records that are assigned to the fields of the first row or column correspond to different locations and/or spatial orientations of the first region of the specimen relative to the optical axis;

the data records that are assigned to the fields of the second row or column correspond to different locations and/or spatial orientations of the second region of the specimen relative to the optical axis;

each data record comprises additional information so that that a relationship between all the data records is represented in the two-dimensional table; and the control apparatus is configured to move the movable specimen stage relative to the optical axis upon actuation of the user interface at a selected field of the two-dimensional table so that the movement is performed until the first or second region of the specimen assigned to the selected field assumes a location and/or spatial orientation relative to the optical axis that is described in the data record assigned to the selected field.

16. The microscope system of claim 15, wherein:

the user interface is configured to allocate commands to the stored data records that are assigned to the fields of the two-dimensional table assigned to the first region of the specimen;

the user interface is configured to allocate commands to the stored data records that are assigned to the fields of the two-dimensional table assigned to the second region of the specimen;

the control apparatus is configured to calculate and assign an associated data record for a first field assigned to the second region of the specimen;

the associated data record corresponds to the command allocated to the first field;

a stored data record assigned to the second region of the specimen is taken into account in a second field when calculating the data record;

the second field is assigned to the second region of the specimen;

a stored data record assigned to the first region of the specimen is taken into account when calculating the data record; and the stored data record is assigned to a field which has the same command allocated thereto as the field for which the data record should be calculated and assigned.

17. The microscope system of claim 15, wherein:

the user interface is embodied to configured commands from a list of commands to the fields of the two-dimensional table assigned to the first region of the specimen and/or to the fields of the two-dimensional table assigned to the second region of the specimen;

the control apparatus is configured to calculate and assign an associated data record to a selected field;

the associated data record corresponds to the command assigned to this selected field;

a stored data record is taken into account when calculating the data record; and the stored data record is assigned to another field that is assigned to the same region of the specimen.

18. The method of claim 8, wherein:

for each of the first and second data records, the data record further defines a label for the position of the region of interest on the specimen; and the graphical user interface displays the label as text.

19. The method of claim 18, wherein, for each of the first and second data records, the data record further defines a label for the position of the region of interest on the specimen.

20. The method of claim 1, wherein:

the first data record defines a tilt angle of the region of interest on the specimen in the first position relative to the optical axis; and the second data record defines a tilt angle of the region of interest on the specimen in the second position relative to the optical axis.

21. The method of claim 1, further comprising:

storing in the memory further data records of the two-dimensional table, each of the further data records defining a corresponding position of the region of interest on the specimen in the three mutually perpendicular spatial directions, and each of the further data records defining a spatial orientation of the region of interest on the specimen in the corresponding position, the corresponding position being linked to the first position; and calling one of the stored further data records from the two-dimensional table so that the movable specimen stage is moved so that the region of interest on the specimen is held at the corresponding position of the specimen.

* * * * *